US006725565B2

United States Patent
Harano et al.

(10) Patent No.: US 6,725,565 B2
(45) Date of Patent: Apr. 27, 2004

(54) METHOD FOR VACUUM DRYING OF SUBSTRATE

(75) Inventors: Riichiro Harano, Yokohama (JP); Toru Watari, Yokohama (JP)

(73) Assignee: Sprout, Co., Ltd., Kanagawa (JP)

( * ) Notice: Subject to any disclaimer, the term of this patent is extended or adjusted under 35 U.S.C. 154(b) by 0 days.

(21) Appl. No.: 10/307,809

(22) Filed: Dec. 2, 2002

(65) Prior Publication Data
US 2003/0115770 A1 Jun. 26, 2003

(30) Foreign Application Priority Data

Dec. 4, 2001 (JP) ....................................... 2001-369775

(51) Int. Cl.[7] ................................................. F26B 3/34
(52) U.S. Cl. .............................. 34/266; 34/406; 34/467; 34/92; 438/906
(58) Field of Search ........................... 34/92, 60, 61, 34/467, 469, 470, 406, 407, 408, 266; 438/906

(56) References Cited

U.S. PATENT DOCUMENTS 6,171,104 B1 * 1/2001 Saito et al. .................... 432/18
6,276,072 B1 * 8/2001 Morad et al. .................. 34/428

* cited by examiner

Primary Examiner—Henry Bennett
Assistant Examiner—Camtu Nguyen
(74) Attorney, Agent, or Firm—Slater & Matsil, L.L.P.

(57) ABSTRACT

A method for vacuum drying of a substrate which can eliminate not only the moisture adhered to the substrate surface but also the moisture impregnated inside of the films which form the devices in a shot time without deforming nor deteriorating the devices formed on the substrate in the drying. The method for vacuum drying of a substrate, concerning a method for drying a substrate by processing the substrate surface in a desired condition, cleaning the processed substrate with cleaning liquid, and drying the cleaned substrate, comprises the steps of heating the substrate surface to a predetermined temperature to vaporize the moisture of the surface as vapor and thereby detach the moisture from the substrate to outside, and vacuuming the detached vapor at a predetermined vacuum pressure to eliminate the moisture from the wafer.

17 Claims, 3 Drawing Sheets

METHOD FOR VACUUM DRYING OF SUBSTRATE

FIELD OF THE INVENTION

This invention relates to a method for vacuum drying of a substrate, such as a semiconductor wafer, and more particularly to a method for vacuum drying of a substrate applicable for a finer patterning of devices.

BACKGROUND OF THE INVENTION

Conventionally, devices on semiconductor wafers have been fabricated by repeating a series of steps comprising film-forming, wafer processing step mainly consisting of lithography and etching, cleaning, and drying step. In particular, the technology for drying a substrate in the drying step is used to eliminate the residue of the ultrapure water used mainly in rinsing the cleaning liquid or the remaining moisture included in the cleaning liquid adhered to the substrate during the cleaning step. The conventional technology for drying a substrate can be roughly classified into spin-drying, organic solvent displacement drying, heat drying, and decompression drying.

However, due to the finer patterning and three-dimensional geometry of the devices in recent pursuit of a higher density of LSI, an event has arisen where none of the above drying technology can sufficiently dry substrates.

More particularly, in the processing step, contact holes or via holes to lead electrodes are formed after formation of interlayer insulator films accompanied with the finer and three-dimensional device structure, and the diameters and depths of such holes have become remarkably smaller and deeper due to the finer patterning of the devices. In the case where the pattern size of the LSI is approximately 0.5 $\mu$m or less, it is quite difficult to physically blow out and eliminate the remaining moisture accumulated in and/or between high aspect ratio patterns which are mainly the contact holes or via holes by simply centrifugal force in the spin drying, and it is also difficult to dry the moisture after the moisture is simply displaced with organic solvent in the organic solvent displacement drying technology.

Therefore, particularly with the trend that the pattern size of the substrate has become smaller and smaller, several new drying technology have begun to be used. One of such technologies is known as IPA vapor drying method that displaces the water on the wafer with isopropyl alcohol (hereinafter referred to as IPA) by use of the vapor of heated IPA and also by use of the difference of vapor pressure between the IPA and pure water, and then places the whole substrate into the atmosphere or a reduced pressure atmosphere in order to immediately vaporize and eliminate the IPA with which the water is completely displaced. On the other hand, the Marangoni drying technology utilizing so-called Marangoni effect has been developed and used, which vaporizes the IPA with which the water is displaced, while the IPA being free-fallen on the wafer surface by use of the high permeability and high water-solubility of the IPA and also by use of the difference in surface tension gradients of the IPA and water.

However, due to the finer and three-dimensional device in recent pursuit of a much higher density LSI, the aspect ratio of the entire patterns which are mainly contact holes or via holes has been further increasing and then so-called low dielectric constant insulating materials have been developed and begun to be used.

More specifically, due to the finer patterning of devices, low dielectric constant insulating materials have been developed as interlayer insulating films in order to achieve high performance multi-layer interconnection wiring.

FIG. 3 and FIG. 4 are examples of magnified cross sectional views of the metal wiring layers formed on a finely patterned wafer immediately after the processing. As shown in FIG. 3 and FIG. 4, an insulating layer is formed on a silicon layer, and a contact hole or via hole H is formed running through the insulating layer. Low dielectric constant insulating material may be, for example, an inorganic or organic material (lowk A in FIG. 3) consisting of siloxane-family for Al—Cu, and a porous material (lowk B in FIG. 4) for Cu to achieve a lower dielectric constant.

The former siloxane-family material is weak against heat and thus its composition can be damaged when heated to above 200° C., thereby the risk that moisture can be produced in the film, is increased. Moreover, depending on the conditions of the processing step, moisture can be produced in the film due to the effect of the processing step conditions themselves, or moisture can be impregnated in the film due to the ultra pure water used in the cleaning step after the processing step.

On the contrary, the latter porous material may be inorganic in most cases and can be an effective film to realize low dielectric constant, however, its porous structure presents a problem in that it tends to absorb moisture in the film inside.

In the interconnection wiring step, such moisture in the hole configuration or in the film which forms the device can be the main cause for corroding metal wiring due to the reaction due to the remaining moisture in the hole after the wirings being formed and the metal of the wiring material, or may be the cause of after-corrosion due to the occurrence of cracks in the insulating films.

Either of them may be significant loss of quality to the semiconductor wafer products.

Accordingly, it is essential to completely eliminate the moisture remaining in the device prior to the film-forming processing.

In this respect, it is necessary to raise the temperature of the wafer for the conventional heat drying technology, which may require excessive heating (for example, over 100□) in order to effectively eliminate the moisture impregnated in the insulating film. In this case, the risk can be increased such that the heat causes deterioration or damage to the device itself that is formed on the wafer surface. Moreover, in the recent ultra-finer patterning devices, the applied heat tends to cause pattern deformation or film deterioration because of the unevenness of the high aspect ratio patterns which are mainly contact holes or via holes formed on the wafer surface. Particularly, in the case that the interlayer insulating film is a siloxane-family material, the heat in the presence of oxygen adversely results in additional moisture produced in the film as described above.

Therefore, it is quite difficult or almost impossible to effectively dry and eliminate the moisture impregnated inside only by the heat drying, maintaining device quality.

On the other hand, in the conventional decompression drying technology, it is necessary to increase vacuum pressure and physically evacuate the inside moisture out of the wafer surface in order to effectively eliminate the moisture impregnated in the insulating film, increasing high vacuum pressure. However, due to the unevenness of the high aspect ratio patterns which are mainly contact holes or via holes formed on the wafer surface, even if the high vacuum pressure is increased, the inside moisture cannot be evacuated or, even if possible, it takes a significant amount of time due to the effect of the surface tension of the water remaining in the holes or the effect of the hydrophilic deposition film. Particularly, in the case that the interlayer insulating film is a porous material, it is difficult to physically evacuate the moisture in the holes because of its porous structure.

In the conventional drying technology using IPA, it is quite difficult to diffuse the IPA into water within a specified time period (for example within 2 minutes), and it is difficult to eliminate the water. Moreover, the IPA is designated as a hazardous material under the Fire Defense Law and is classified to alcohol in the $4^{th}$ category, therefore and it is flammable and explosive, it is desirable to avoid the use of the IPA from the point of view of safety and control cost, if possible.

In view of the above, a drying technology which can cope with various aspects such as electric reliability, cost, and safety in finely patterning the devices is strongly needed recently.

Embodiments of the present invention can also provide a vacuum drying method for substrates which can eliminate in a short time not only the moisture adhered to the wafer surface but also the moisture impregnated inside the film that forms the device without deforming or deteriorating the device formed on the wafer in the drying step.

In addition, embodiments of the present invention can provide a vacuum drying method for substrates which can dry and eliminate the moisture adhered to the wafer by adjusting the heating temperature and/or vacuum pressure depending on the fine patternings formed in the devices.

SUMMARY OF THE INVENTION

To solve the above-mentioned problems, the preferred embodiment of the present invention provides a vacuum drying method for substrates. The preferred method includes drying a substrate by processing the wafer surface in a desired condition, cleaning the processed substrates with cleaning liquid, and drying the cleaned substrates. For example, the drying step can include: detaching the moisture from the substrate to outside heating the substrates surface to a predetermined temperature, and vaporizing the moisture of the surface above-mentioned as vapor: and eliminate the moisture from the substrate vacuuming the detached vapor at predetermined vacuum pressure.

In addition, the moisture of the surface can be the moisture impregnated in and/or between the fine patterns formed on the substrates or the moisture impregnated inside the insulating film consisting of the fine patterns.

Further in addition, the moisture may be the moisture included in the processing liquid and/or the cleaning liquid, and/or the residual of ultrapure water used in rinsing the processing liquid and/or the cleaning liquid.

In addition, the method further comprises a step of previously placing the substrates to be dried in a vacuum atmosphere at a vacuum pressure so that the evaporating temperature of the moisture can be lowered.

Moreover, the heating step to a predetermined heating temperature is preferably performed by radiation heating from outside of the vacuum atmosphere.

In addition, preferably, the vacuuming step to vacuum pressure is performed by a cryopump, and the cryopump adsorbs and collects the vapor detached from the wafer.

Although the vacuum drying method for substrates of the present invention is a drying technology combining the conventional heat drying technology with the depression drying technology, the methods are not a mere combination of both drying technology but is characterized by having synergistic effects of both technology.

According to the vacuum drying method for substrates of the present invention, it is possible to vaporize as vapor not only the residual moisture on the substrates surface after the cleaning but also the moisture in the inside films consisting of fine patterns, by heating the substrates surface to a predetermined temperature.

More specifically, it is possible to vaporize the moisture as vapor not only on the substrates surface but also accumulated in and/or between the high aspect ratio patterns which are mainly contact(s) holes or via holes or the moisture impregnated inside the insulating film consisting of the patterns from inside of the insulating film to outside. By placing the substrates to be dried in a vacuum environment at a vacuum pressure prior to the heat drying, effective heating can be achieved particularly by radiation heating while the evaporating temperature is lowered under a high vacuum pressure. In addition, by the radiation heating particularly by using near infrared rays, inside heating can be achieved with avoiding the damage(s) on the substrates surface by heat.

Then, by vacuuming the vapor detached from the substrates, the moisture can be eliminated from the substrates.

As described above, the heat drying enhances the detachment of the moisture from the substrates by the phase change from the liquid into the vapor, while the vacuum drying eliminates the vapor detached from the substrates completely, vacuuming the moisture from the substrates.

In this case, when only the heat drying is performed, some insulating films may be damaged or deteriorated by the heat or moisture occurrence may be adversely caused inside the insulating films by the heating in the presence of oxygen.

On the other hand, when only the vacuum drying is performed, even if the vacuum pressure in the atmosphere may be higher, it is almost impossible to or if it is possible it takes considerable amount of time to evacuate and eliminate the moisture accumulated in and/or between the high aspect ratio patterns which are mainly contact holes or via holes in and/or the moisture impregnated in the insulating film(s) directly from in and/or between the high aspect ratio patterns, or in the insulating film(s) in its liquid phase.

From this angle, by the concomitant use of both methods, that is, by heating the moisture accumulated in and/or between the high aspect ratio patterns or the moisture impregnated in the insulating films to vaporize while the evaporating temperature is lowered under decompression pressure and to detach the moisture from in and/or between the high aspect ratio patterns which are mainly contact holes or via holes or in the insulating films into the atmosphere, and then by immediately vacuuming the detached moisture, the vaporized moisture can be completely eliminated.

In this case, a drying method can be provided which can cope with the finer patterning by adjusting the heating temperature in the heat drying and the vacuum pressure in the vacuum drying according to the processing technique of the interlayer insulating films and/or cleaning technique.

In one aspect, the present invention provides a vacuum drying method for substrates which can effectively dry the wafer on which finely patterned devices are formed.

DETAILED DESCRIPTION OF THE PREFERRED EMBODIMENTS

Figure 1:
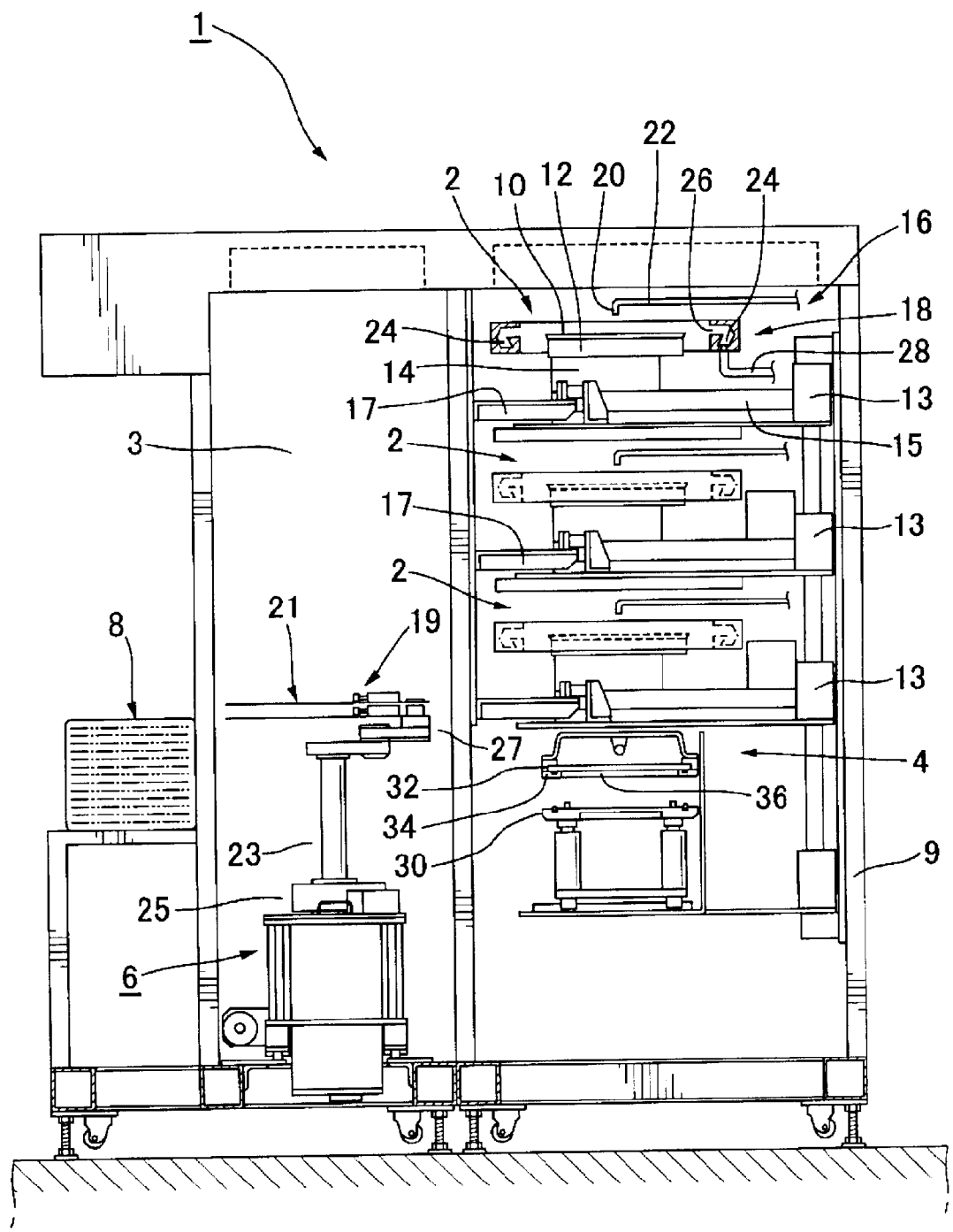
FIG. 1 is a schematic cross sectional diagram of a substrate processing apparatus according to an embodiment of the present invention.
Figure 2:
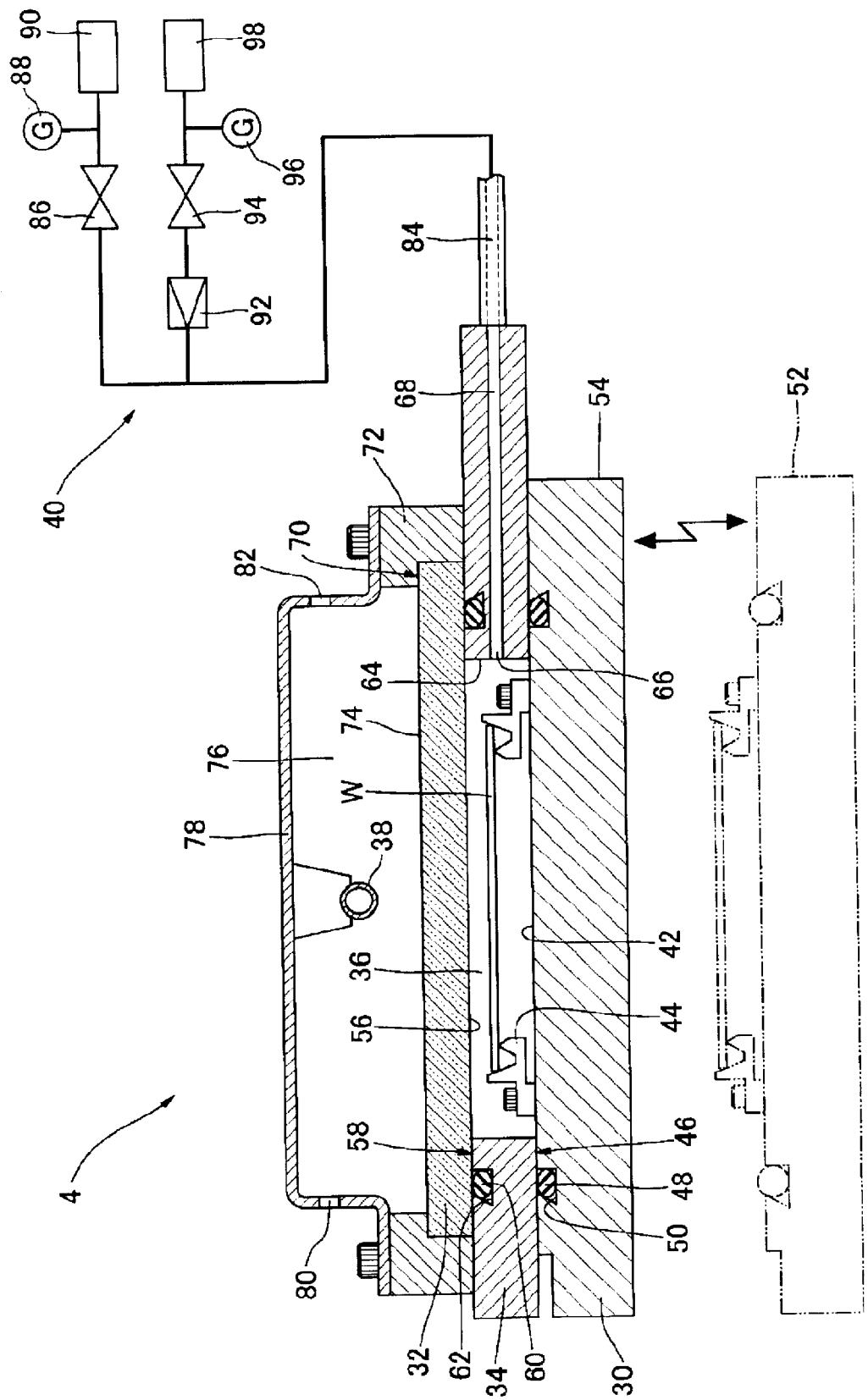
FIG. 2 is a schematic cross sectional diagram of a vacuum drying processing unit according to an embodiment of the present invention.
Figure 3:
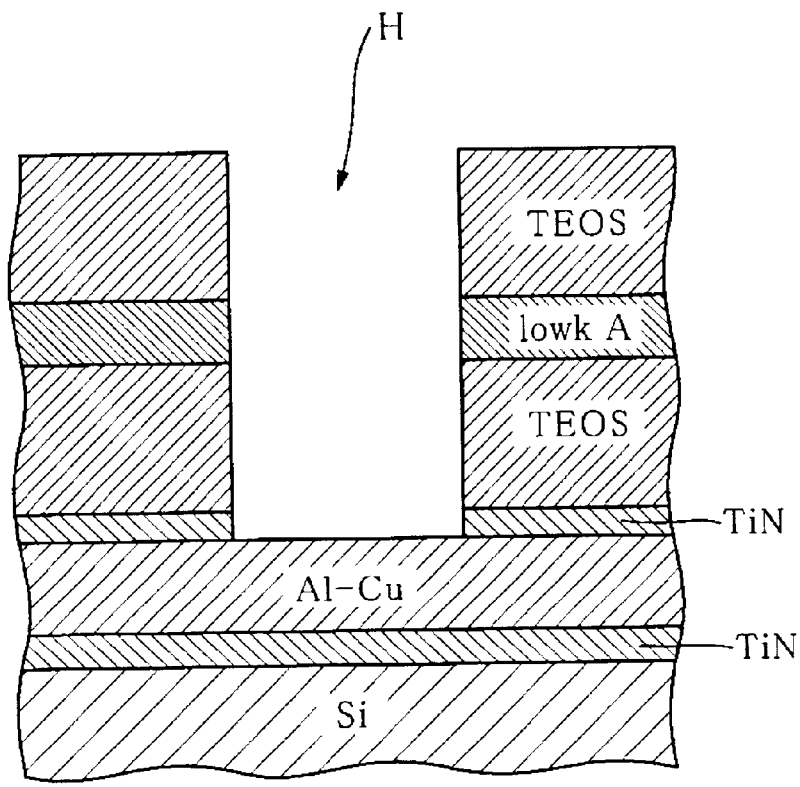
FIG. 3 is a magnified cross sectional diagram of a via hole wherein aluminum wirings are used.
Figure 4:
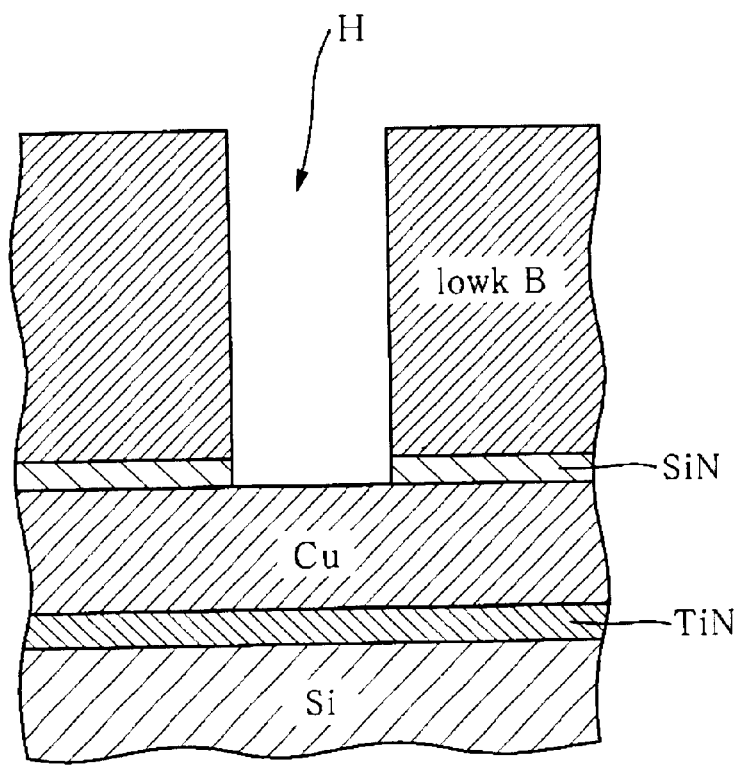
FIG. 4 is a magnified cross sectional diagram of a via hole wherein copper wiring is used.

Embodiments of a substrate vacuum drying processing apparatus for performing the vacuum drying method for substrates of the present invention are now described in detail with reference to FIG. 1 and FIG. 2. FIG. 1 shows a schematic cross sectional diagram of a substrate processing apparatus comprising the vacuum drying processing apparatus for substrates, including an embodiment of the present invention. FIG. 2 shows a schematic cross sectional diagram of an embodiment of a vacuum drying processing apparatus for substrates according to the present invention.

As shown in FIG. 1, a substrate processing apparatus 1 has an integral flame configuration 9 comprising three single-substrate wet processing/cleaning units positioned in a vertically stacked relationship, a substrate vacuum drying processing unit 4 positioned under these wet processing/cleaning units 2, namely at the lowest position of the processing apparatus 1, a wafer transferring equipment 6 for transferring the substrate W between the units 2 and 4 vertically in a transferring space 3, and a cassette 8 for storing the substrate W before and after the wet processing.

The substrate processing apparatus 1 transfers an unprocessed substrate W stored in the cassette 8 to the wet processing/cleaning unit 2 by the transferring equipment 6 and performs the wet processing or cleaning of the substrate W in the wet processing/cleaning unit 2, and then transfers the wet processed or cleaned substrate W to the vacuum drying processing unit 4 by the transferring equipment 6 and performs the vacuum drying processing of the wet processed or cleaned substrate W in the vacuum drying processing unit 4.

Because the vacuum drying processing unit 4 in the wafer processing apparatus 1 is, as described later, a configuration which does not use the IPA that has explosive nature, the units 2 and 4 including the vacuum drying processing unit 4 can be placed simply adjacent each other vertically in a stacked relationship. Accordingly, the installation space occupied in the horizontal direction can be decreased. Moreover, because the transferring direction of the substrate W between the units 2 and 4 is one in a vertical direction, the transferring time can be shortened and thus the throughput of the processing apparatus 1 can be increased.

The substrate wet processing/cleaning unit 2 is now generally described. The substrate wet processing/cleaning unit 2 generally comprises a substrate holding equipment 12 having a chuck plane 10 that contactlessly holds the substrate W from beneath, a wafer rotating equipment 14 for rotating the contactlessly held substrate W approximately on the vertical axis, a wet processing liquid/cleaning liquid feeding equipment 16 for feeding the wet processing liquid or cleaning liquid on the center of the rotating substrate W, and a wet processing liquid/cleaning liquid collecting equipment 18 for collecting the processing liquid or cleaning liquid after the wet processing of the substrate W. On the side of the wafer holding equipment, a notch alignment 17 is provided wherein the notch alignment 17 has an arm 15 operable to rotate horizontally on an axis 13 and move vertically up and down, thereby the substrate which is transferred to the wet processing/cleaning level by the transferring equipment 6 is once relayed by the notch alignment 17 and then notch alignment is performed at that time.

The substrate holding equipment 12 is the type which contactlessly holds the substrate W above the chuck plane 10 in the air-bearing scheme or the Bernoulli's scheme by squirting holding gas, for example nitrogen gas, toward the lower surface of the substrate W from below. Alternatively, the wafer holding equipment 12 may be the type which adsorbs, namely holds in contact with, the substrate W by an adsorb-holding scheme.

The substrate rotating equipment 14 comprises, for example, a conventionally known electric motor. In the wet processing of the substrate W, paddling process of the substrate W can be performed depending on the types of wet processing liquid. In that case, the rotating equipment 14 rotates the substrate W at a lower speed, for example, rotates at zero–300 rpm. In the case of performing normal wet processing, the rotating equipment 14 rotates the substrates W at a higher speed, for example, rotates at 400–3000 rpm.

The wafer wet processing liquid/cleaning liquid feeding equipment 16 generally comprises a feeding source (not shown) of the wet processing liquid and cleaning liquid, a feeding nozzle 20 provided above the substrate, and a feeding tube 22 connecting the feeding source and the feeding nozzle 20. When the wet processing liquid is fed from the feeding nozzle 20 from above toward the center of the substrate W which is rotated by the rotating equipment 14, the wet processing liquid diffuses on the substrate surface in a radial direction toward the periphery edge of the substrate W, thereby a predetermined wet processing of the upper surface of the substrate W can be performed. Alternatively, depending on the substrate W to be wet processed, the processing of the both surfaces of the substrate W can be simultaneously performed by adding a wet processing liquid feeding equipment (not shown) for feeding the wet processing liquid from below the substrate W, or the wet processing of the upper surface and bevel portion of the substrate W can be simultaneously performed by use of the nature that the wet processing liquid fed on the upper surface of the substrate W further turns to the lower surface of the wafer W after reaching the periphery edge of the wafer by centrifugal force.

The wet processing liquid/cleaning liquid collecting equipment 18 comprises an annular collecting duct 24 for collecting the wet processing liquid and cleaning liquid splashed from the periphery edge of the substrate W radially outward, wherein the annular collecting duct 24 comprises an annular opening 26 opening toward the periphery edge of the substrate W. In addition, the wet processing liquid/cleaning liquid collecting equipment 18 comprises a mist exhausting equipment 28 connected to the annular collecting duct 24. The exhausting equipment 28 sucks the mist, which is produced when the wet processing liquid or cleaning liquid are splashed, in the annular collecting duct 24 and consecutively exhausts the sucked mist to the outside.

As shown in FIG. 1, the transferring unit 6 has the feature of a transfer robot, comprising an arm portion 19, and a double-fork 21, attached at the tip of the arm portion 19, for transferring the wafer one by one between the cassette and either one of the processing unit or between the processing units. The arm portion 19 is operable to move up and down vertically (z axis) by a sliding mechanism 23, move in a rotational direction (θ axis) on the vertical axis of the transfer robot 6 by a (rotating) rotation mechanism 25, and move radially (R axis) by a link junction mechanism 27. The double-fork 21 comprises a pair of holding planes, each of them are opposing each other, for the contactlessly holding (the) substrate in the air-bearing scheme or the Bernoulli's scheme by squirting gas, and a holding switching means for switching the contactless holding of the substrate on one of the holding plane to the contactless holding on the other holding plane, wherein each fork is operable to individually move relatively along the holding plane.

With these structures (configurations), through the movement of the arm portion 19 upward or downward, the movement in rotational direction and the movement in radial direction, the double-fork 21 holds the substrate on either one of the holding planes by moving upward or downward or moving radially outward or inward wherein the rotating direction is adjusted, and concurrently moving one holding plane relatively with respect to the other holding plane.

Now, the vacuum drying processing unit 4 of an embodiment of the present invention will be described in detail.

As shown in FIG. 2, the vacuum drying processing unit 4 generally comprises a vacuum drying chamber 36 formed by interposing an annular ring 34 between a bottom plate 30 and a top plate 32, a radiation heating means 38 provided above the top plate 32, and a vacuuming means 40 connecting to the vacuum drying chamber 36.

The upper surface 42 of the bottom plate 30 has the size that a substrate W can be placed. The substrate W to be dried may be various types such as a semiconductor wafer, a glass substrate for liquid crystal display (LCD), and a glass substrate for plasma display panel (PDP), which diameters are typically 6 to 8 inches, however, some of them are 3 inches to 12 inches. In addition, on the upper surface 42 of the bottom plate 30, fixing tools 44 are provided at predetermined angular intervals toward the periphery of the substrate W for placing the substrate W. By gradually increasing vacuum pressure in drying processing or by positioning the direction of an opening 66, described later, for vacuuming the air in the vacuum drying chamber 36 to be lateral with respect to the substrate W, generation of dust such as particles can be restrained as long as a significant differential pressure is not caused between the upper surface side and lower surface side of the substrate W, because the fixing tools 44 simply place the substrate W without specific fixing functions. At an outer edge region 46 that overlaps with the annular ring 34 on the upper surface 42 of the bottom plate 30, an annular groove 50 is provided for inserting an O-ring 48 with the object of maintaining the airtight in the vacuum drying chamber 36. In addition, the bottom plate 30 is operable to move up and down vertically relative with respect to the top plate 32 by a vertical driving equipment (not shown) between a lower position 52 where the substrate W is mounted to or dismounted from the top surface 42, and an upper position 54 by which the vacuum drying chamber 36 is formed to perform the vacuum drying processing of the substrate W.

The annular ring 34 is placed on the bottom plate 30 along the outer edge region 46 of the bottom plate 30 to form a concave portion, that is, the vacuum drying chamber 36, inside of the annular ring 34 in cooperation with the bottom plate 30. On the upper surface of the annular ring 34 and in the region 58 which overlaps with the lower surface 56 of the top plate 32, an annular groove 62 is provided for inserting an O-ring 60 with the object of maintaining the airtight in the vacuum drying chamber 36. In addition, the annular ring 34 comprises the opening 66 on the inner periphery surface 64, and a gas duct 68 communicating with outside of the annular ring 34 from the opening 66 through the inside of the annular ring 34. The gas duct 68 may be used for vacuuming the air in the vacuum drying chamber 36 or feeding nitrogen gas into the vacuum drying chamber 36.

The top plate 32 consists of quartz and the periphery portion 70 of the top plate 32 is fixed in the vertical direction and radial direction by a fixing annular tool 72 made of Delrin® which cross section is a reverse L-shape. The fixing annular tool 72 is fastened to the annular ring 34 by fastening tools such as bolts. Because the top plate 32 is made of quartz, the heat from the radiation heating means 38, which will be described later, sufficiently flows through the top plate 32 and can be conducted to the substrate W in the vacuum drying chamber 36. Preferably, the thickness of the top plate 32 is decided in consideration of the conduction of the radiation heat.

As described above, the vacuum drying chamber 36 is formed by the inner periphery surface 64 of the annular ring 34, the upper surface 42 of the bottom plate 30, and the lower surface 56 of the top plate 32. Preferably, the internal height of the vacuum drying chamber 36 is 1 cm or less, and the diameter of the chamber is 60 cm or less.

With these structure, it is possible to shorten the time required for vacuuming the inside of the vacuum drying chamber 36 to the utmost, that is, to increase vacuum pressure in the vacuum drying chamber 36 in a short time, and also to increase the efficiency of the radiation heat from outside by the radiation heating means 38 depending on the increases of vacuum pressure.

The radiation heating means 38 preferably comprises a near infrared ray heating equipment 38 which is fixed at approximately center of the cover 78 which is fastened to the fixing annular tool 72 and is overhanging from the fixing annular tool 72 to make a space 76 above the upper surface 74 of the top plate 32. In the cover 78, an inflow opening 80 and an outflow opening 82 are provided for communicating with the space 76 which is formed byte cover 78 and the upper surface 74 of the top plate 32. The inflow opening 80 and the outflow opening 82 are opposing each other so that the gas, for example air, for preventing overheat of the near infrared ray heating equipment 38 flows from the inflow opening 80 to the outflow opening 82.

The vacuuming means 40 comprises a pipe 84 connected with the gas duct 68 of the annular ring 34. The pipe 84 branches into two, one is connected to a cryopump 90 via a flow control valve 86 and a pressure gauge 88, and the other is connected to a feeding equipment 98 for feeding nitrogen gas via a filter 92 for eliminating particles, a flow control valve 94, and a pressure gauge 96. The cryopump 90 is advantageous in that it can adsorb and collect the vapor vacuumed from the vacuum drying chamber. Alternatively, a normal vacuum pump can be used if the inside of the vacuum drying chamber is vacuumed to a predetermined vacuum pressure.

The (degree of vacuum) vacuum pressure to be achieved may be set at a vacuum pressure such as $10^{-5}$ Torr to 10 Torr where the vapor detached form the (wafer) substrate can be surely eliminated and exhausted depending on the finer patterns formed on the (wafer) substrate.

Then the operations of the substrate wet processing/cleaning unit 2 and vacuum drying processing unit 4 which comprise above structure, and the method for vacuum drying will be now described.

To begin with, the single-wafer processing step of the substrate W by the substrate wet processing/cleaning unit 2 is described. The substrate W transferred from the cassette 8 to the wafer wet processing/cleaning unit 2 by the substrate transferring equipment 6 is positioned at a predetermined position above the chuck plane 10 of the substrate holding equipment 12 by the notch alignment 17.

In more detail, the substrate W stored in the cassette 8 is taken out by the lower holding surface of the double-fork 21. At that time, the vertical position of the lower holding surface is matched between the substrate W to be processed and the substrate W placed beneath the substrate W to be processed. Then, the lower holding surface is advanced radially outward, thereby the lower holding surface is positioned not opposing to the upper holding surface and the holding surface of the lower holding surface is positioned opposing to the substrate W. By squirting gas from the lower holding surface and raising the double-fork 21, the lower holding surface contactlessly holds the substrate W in a scooping fashion. Then, the lower holding surface is backed radially inward, thereby the lower holding surface is positioned opposing to the upper holding surface and the substrate W is sandwiched between the upper and lower holding surfaces. Then, the holding of the substrate by the lower holding surface is switched to the holding of the substrate by the upper holding surface, thereby the substrate W is drawn from both of the lower holding surface and the upper holding surface. Then, the gas squirted from the lower holding surface is stopped. The substrate W is drawn by the upper holding surface, raised and contactlessly held by the upper holding surface. Finally, the substrate W is fixed to the notch alignment 17 which is previously rotationally positioned at the wafer receiving position. More specifically, the upper holding surface is advanced toward the notch alignment 17, and the substrate W is placed above the notch alignment 17. At the point that the substrate W can be held by the notch alignment 17, the gas squirted from the upper holding surface is stopped, and the wafer W is held by the notch alignment 17. Then, the upper holding surface is backed and concurrently the notch alignment 17 is horizontally rotated and moved in a vertical direction from the substrate receiving position to the substrate processing position. This completes the transfer of the substrate W from the cassette 8 to the processing/cleaning unit 2.

Then, while the substrate W is contactlessly held by nitrogen gas squirted from the substrate holding equipment 12, the substrate W is rotated by the substrate rotating equipment 14. After that, when the processing liquid is provided toward the center of the substrate W from the wet processing liquid/cleaning liquid feeding equipment 16, the processing liquid diffuses over the upper surface of the (wafer) substrate W, thereby the wet processing of the upper surface of the substrate W is performed. Then, the wet processing liquid which is splashed from the peripheral edge of the substrate W due to the rotation of the substrate W enters the annular opening 26 of the annular collecting duct 24 and is collected by the wet processing liquid collecting equipment 18. The mist caused by the (splashed) splash of the wet processing liquid or cleaning liquid is exhausted via the annular opening 26 and the annular collecting duct 24 by the mist exhausting equipment 28. Additionally, the rinse processing can be subsequently performed by providing the cleaning liquid from the wet processing liquid/cleaning liquid feeding equipment 16 to the substrate W, then after that, so-called spin drying can be performed by rotating the substrate to dry, and a preliminary step of the following vacuum drying processing step can be performed.

Now, the vacuum drying step by the substrate vacuum drying processing unit 4 will be described. The wet processed or cleaned substrate W transferred to the lower position level 52 of the vacuum drying processing unit 4 is placed on the upper surface 42 of the bottom plate 30, which is previously lowered to the lower position 52, by the transferring equipment 6 in a similar way as the transferring method from the cassette to the processing unit, and the substrate W is fixed by the fixing tools 44. Then, the bottom plate 30 is lifted to the upper position 54 to form the vacuum drying chamber 36. Thus, the substrate W to be dried is placed in the vacuum drying chamber 36.

Then, the inside of the vacuum drying chamber 36 is vacuumed to a predetermined vacuum pressure, for example ranging from about $10^{-5}$ Torr to about 10 Torr, by operating the cryopump 90. Although the substrate W is simply placed on the fixing tools 44, there is no risk that the substrate W itself in the vacuum drying chamber 36 is drawn toward the opening 66 and deformed or damaged because the vacuum pressure is gradually increased during the drying processing, and the substrate W can stand until the vacuum reaches a predetermined vacuum pressure due to its own weight. Then, the heat is radiated from outside of the vacuum drying chamber 36 toward the upper surface of the substrate W by operating the near infrared ray heating equipment 38 to heat the substrate W to a predetermined temperature, for example ranging from about 30° C. to about 100° C. The moisture accumulated in and/or between the high aspect ratio patterns which are mainly contact holes or via holes or the moisture impregnated in the insulating films comprising the patterns is heated and vaporized to become vapor at a lowered evaporating temperature under decompression. The vapor is detached from the fine patterns or inside of the insulating film into the atmosphere. Then, the detached vapor in the atmosphere is immediately vacuumed under a predetermined vacuum pressure.

As described above, the heat drying enhances the detachment of the vapor from the substrate by the phase change from the liquid into the vapor, while the vacuum drying facilitates the heat drying and also vacuums the vapor which is detached from the substrate and is floating in the atmosphere and completely eliminates the moisture from the substrate. In this case, it is possible to provide a drying technology which can cope with finer patterns by adjusting the heating temperature in the heat drying and the vacuum pressure in the vacuum drying depending on the processing technique of the interlayer insulating films and/or the cleaning technique.

Then, in order to restrain from causing particles, nitrogen gas is slowly fed into the vacuum drying chamber 36 by the feeding equipment 98 of the nitrogen gas to the level same as the atmospheric pressure. Thereby, the vacuum pressure in the vacuum drying chamber 36 is decreased and it is possible to take out the substrate W which drying processing is completed.

Finally, the bottom plate 30 is lowered to the lower position 52, and substrate W which drying processing is complete is taken out. Then, the substrate W is stored in the cassette 8 by the transferring equipment 6 in a similar way as the transferring method from the cassette to the processing unit, or transferred to the wet processing/cleaning unit 2 for the next processing.

In the vacuuming step described above, the vacuuming can be performed in a two-step, a preliminary vacuuming step at a lower vacuum pressure, for example on the order of approximately 10 Torr, and a main vacuuming step at a higher vacuum pressure, for example to on the order of approximately $10^{-3}$ Torr, with the object of protecting the (wafer) substrate to be dried. This makes it possible to protect the substrate itself and to restrain from causing particles better than the case where the atmospheric pressure is rapidly vacuumed to a high vacuum pressure at a time.

While the embodiments of the present invention have been described in detail, various alternations and modifications can be made within the scope of the invention. For example, the drying step is described to be performed as post-step of the cleaning step in the embodiments, but not limited to it. The embodiments are applicable to, for example, the steps to be performed as pre-step of the processing step such as the degassing or the dehydration step prior to the film-forming step. In addition, the drying processing is described as a single-wafer processing scheme in the embodiment, but not limited to it. By making the capacity of the vacuum drying chamber lager and providing substrate fixing tools, for example on the lower surface of the quartz bottom plate also the same as on the upper surface of the top plate, the vacuum drying processing can be performed simultaneously for a plurality of substrates by properly adjusting the heating temperature and the vacuum pressure.

As described above, according to the vacuum drying method of this invention, it is possible to effectively dry substrates on which finely patterned devices are formed.

According to the vacuum drying method of this invention, not only the residue of the ultrapure water used in rinsing mainly the cleaning liquid or the remaining moisture included in the cleaning liquid adhered to the substrate surface, but also the residue of the ultrapure water used in rinsing mainly the cleaning liquid or the remaining moisture included in the cleaning liquid impregnated inside the film, which forms the device, can be eliminated in a short time without deforming nor deteriorating the devices formed on the substrate in the substrate drying step.

According to the vacuum drying method of this invention, the residue of the ultrapure water used in rinsing mainly the cleaning liquid or the remaining moisture include in the cleaning liquid adhered to the substrate can be dried and eliminated by adjusting the heating temperature and/or the vacuum pressure depending on the fine patterns formed in the devices.

What is claimed is:

1. A method for vacuum drying of a semiconductor substrate, the method comprising:
    forming patterns including a high aspect ratio of contact holes and/or via holes on a surface of the semiconductor substrate;
    cleaning the surface of the semiconductor substrate with a cleaning liquid;
    placing a sheet of the cleaned semiconductor substrate in a chamber;
    heating the substrate surface to a predetermined temperature to vaporize moisture from the surface as vapor and thereby drying the moisture from the semiconductor substrate; and
    vacuuming the removed vapor at a predetermined vacuum pressure to eliminate the moisture from the semiconductor substrate.

2. The method of claim 1, wherein the moisture of that is driven from the semiconductor substrate is moisture impregnated in and/or between the fine patterns formed in or on the semiconductor substrate.

3. The method of claim 1, wherein the moisture that is driven from the semiconductor substrate is moisture inside of an insulating film of the patterns on the surface of the semiconductor substrate.

4. The method of claim 1 wherein the predetermined temperature is between about 30° C. and about 100° C. and wherein the predetermined pressure is between about $10^{-5}$ Torr and about 10 Torr.

5. The method of claim 1, wherein the cleaning liquid is ultra-pure water.

6. The method of claim 1, wherein the vacuuming step is performed by a cryopump, wherein the cryopump absorbs and collects the vapor driven from the substrate.

7. The method of claim 1, further comprising the step of placing the substrate to be dried in vacuum atmosphere at predetermined vacuum pressure prior to the heating step.

8. The method of claim 1, wherein the heating step to a predetermined heating temperature is performed by radiation heating from outside of a vacuum atmosphere.

9. A method of making a semiconductor device, the method comprising:
    processing a surface of a semiconductor device;
    cleaning the processed device with a cleaning liquid; and
    drying the cleaned device by heating the device to a temperature between about 30° C. and 100° C. and vacuuming the device at a predetermined vacuum pressure to eliminate moisture from the device;
    wherein the vacuuming is performed in a two-step process, wherein the two-step process comprises vacuuming a low vacuum pressure and then vacuuming at a higher vacuum pressure.

10. The method of claim 9, further comprising the step of placing the device in a vacuum atmosphere prior to the drying step.

11. The method claim 9, wherein heating the device is performed by radiation heating from outside of a vacuum atmosphere.

12. The method of claim 9, wherein the vacuuming is performed by a cryopump, wherein the cryopump absorbs and collects vapor removed from the device.

13. The method of claim 12 wherein the low vacuum pressure is on the order of about 10 Torr and the higher vacuum pressure is on the order of about $10^{-3}$ Torr.

14. The method of claim 12 wherein processing a surface comprises forming a plurality of fine patterns in the surface of the semiconductor device, wherein drying the cleaned device comprises removing moisture that is impregnated in and/or between the fine patterns.

15. The method of claim 14, wherein the fine patterns comprise via holes in an insulating film on the surface of the device, each via hole having a dimension less than about 0.5 µm.

16. A method of making a semiconductor device, the method comprising:
    processing a surface of a semiconductor device by forming a plurality of fine patterns in the surface of the semiconductor device;
    cleaning the processed device with a cleaning liquid; and
    drying the cleaned device by heating the device to a temperature between about 30° and 100° C. and vacuuming the device at a predetermined vacuum pressure to eliminate moisture from the device, wherein drying the cleaned device comprises removing moisture that is impregnated in and/or between the fine patterns.

17. The method of claim 16, wherein the fine patterns comprise via holes in an insulating film on the surface of the device, each via hole having a dimension less than about 0.5 µm.

* * * * *